United States Patent [19]

Tisinger

[11] Patent Number: 5,418,410
[45] Date of Patent: May 23, 1995

[54] LEADING EDGE BLANKING CIRCUIT
[75] Inventor: Eric W. Tisinger, Chandler, Ariz.
[73] Assignee: Motorola, Inc., Schaumburg, Ill.
[21] Appl. No.: 67,449
[22] Filed: May 25, 1993
[51] Int. Cl.⁶ .............................................. H03K 5/24
[52] U.S. Cl. ........................................ 327/77; 327/387
[58] Field of Search .............. 307/530, 354, 572, 571, 307/360, 358, 550, 362, 576

[56] References Cited

U.S. PATENT DOCUMENTS

| | | | |
|---|---|---|---|
| 4,914,324 | 4/1990 | Goto | 307/555 |
| 5,027,017 | 6/1991 | Fling | 307/555 |
| 5,162,680 | 11/1992 | Norman et al. | 302/550 |
| 5,175,451 | 12/1992 | Ihara | 307/362 |
| 5,206,553 | 4/1993 | Imai et al. | 307/362 |

FOREIGN PATENT DOCUMENTS 0029022  1/1980  Japan ................... 307/360

OTHER PUBLICATIONS

International Application No. PCT/AU90/00208 having International filing date 21 May 1990, International Publication No. WO 90/14716, International Publication Date 29 Nov. 1990, and having Mark Raymond Kitson as the Inventor/Applicant.
UK Patent Document No. GB 2 257 855A having a Date of filing of 16 Jul. 1990, Application No. 9115658.8, and having Michael Lamoth as the inventor.

Primary Examiner—Timothy P. Callahan
Assistant Examiner—Dinh Le
Attorney, Agent, or Firm—Rennie William Dover

[57] ABSTRACT

A leading edge blanking circuit has been provided. The LEB circuit (20) includes a minimum number of components for monitoring a gate voltage of a transistor (28) and passing a current sense signal, which senses the current level through the transistor, to subsequent control circuitry (32) when the gate voltage exceeds a predetermined threshold ($V_{LEBTH}$). Further, the predetermined threshold is chosen to be between the Miller plateau voltage of the transistor and the desired maximum gate voltage.

5 Claims, 1 Drawing Sheet

LEADING EDGE BLANKING CIRCUIT

FIELD OF THE INVENTION

This invention relates to switching devices and, in particular, to a circuit for blanking a current sense signal of the switching device when the switching device is transitioning.

BACKGROUND OF THE INVENTION

In general, in switching mode power supply (SMPS) applications, current through an inductive load is typically sensed indirectly by monitoring a current through a power transistor wherein the transistor is coupled to the inductive load and the inductive load is further coupled to an input supply voltage. This sensed current signal through the power transistor is used for cycle-by-cycle current limiting and for current mode control. However, during the power transistor turn-on transition, a current spike occurs due to parasitic capacitances primarily occurring due to inductor or transformer interwinding capacitances and power transistor output capacitances. It is well known in the art that this leading edge current spike must be filtered out to prevent the control circuit, which is responsive to the current sense signal, from responding to the current spike.

One simple solution to this problem is to generate a blanking signal that disables the control circuitry for a fixed period of time after the power transistor is turned on. However, a problem with this solution is that the specific time period of the blanking signal must be designed for the worst case current spike pulse width. As a result, the duration of the blanking signal is typically too long for many applications.

Another solution to the problem is to use external timing elements to optimally set the blanking time for each specific application. However, a problem with this solution is that it increases the integrated circuit's pin count as well as the number of external components.

Another solution is described in detail in an IEEE conference proceedings article on Applied Power Electronics Conference (APEC) entitled "A Monolithic Boost Converter for Telecom Applications" by F. J. DE Stasi and T. S. Szepesi wherein FIG. 8 shows an adaptive blanking circuit. However, this adaptive blanking circuit does not work well under short circuit conditions and further the adaptive blanking circuit is quite complex in circuitry.

Hence, there exists a need for an improved leading edge blanking circuit having minimum circuitry and for providing a blanking signal whose pulse width adapts to various operating conditions such as high initial drain voltages, low initial drain voltages, or a drain short circuit condition.

DETAILED DESCRIPTION OF THE DRAWINGS

Figure 1:
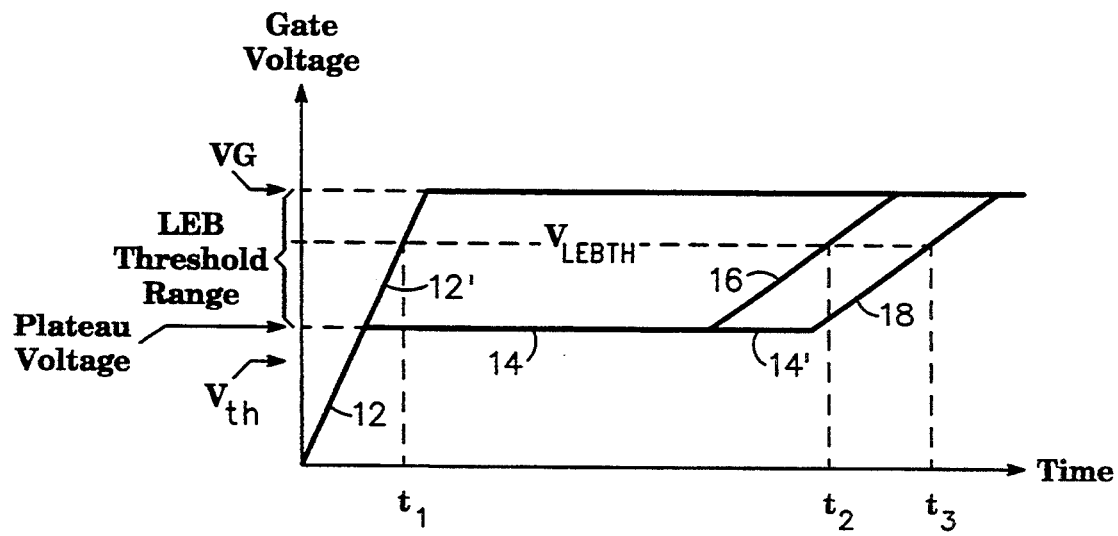
FIG. 1 shows a pictorial diagram illustrating a gate charge profile of a MOSFET power device for short circuit conditions as well as for low input and high input supply voltage conditions.

Referring to FIG. 1, a pictorial diagram illustrating a gate charge profile for a MOSFET device is shown. In general, when a MOSFET device is switched on, the voltage at the gate of the MOSFET device increases up to the desired gate voltage ($V_G$) at a certain rate depending upon whether the initial drain voltage is a high or a low voltage or whether the drain of the MOSFET device is short circuited to the input supply voltage.

In particular, line segments 12 and 12' show the gate charge profile under a short circuit condition. In this case, the gate voltage quickly ramps up to the desired gate voltage in a relatively short period of time. This short circuit condition may occur when the drain of the MOSFET is held high, for example, when the transformer is in a saturated condition.

Horizontal line 14 represents the Miller plateau voltage level for the MOSFET. It is during this time period that substantially all of the gate charge enters the parasitic drain-gate capacitance ($C_{dg}$) wherein this negative feedback capacitance holds the gate voltage substantially constant during the switching transition.

Line segment 16, in conjunction with line segments 12 and 14, represents the gate charge profile to increase the voltage appearing at the gate of the MOSFET up to the desired gate voltage ($V_G$) for a low input supply voltage. Likewise, line segment 18, in conjunction with line segments 12 and 14 and 14', represents the gate charge profile to increase the voltage appearing at the gate of MOSFET up to the desired gate voltage ($V_G$) for a high input supply voltage.

The basic idea to extract from this figure is that depending upon the operating condition of the MOSFET, that is whether a high input supply voltage or a low input supply voltage condition exists, or that its drain is shorted to the input supply voltage (short circuit condition), the time required to ramp the voltage appearing at the gate of the MOSFET to a desired gate voltage ($V_G$) can vary to a large degree. Further, it is important to understand that once the gate voltage on the MOSFET exceeds the Miller plateau voltage, then the current spiking due to the switching of the MOSFET has substantially decreased.

The present invention realizes that having a leading edge blanking circuit with a threshold voltage between the Miller plateau voltage and the desired voltage $V_G$ as denoted by the leading edge blanking (LEB) threshold range shown in FIG. 1, allows one to utilize the voltage appearing at the gate electrode of the MOSFET as a threshold voltage for a leading edge blanking circuit. For example, assuming that a LEB threshold of $V_{LEBTH}$ is chosen, time $t_1$ represents the required time for the gate voltage to exceed threshold voltage $V_{LEBTH}$ for a short circuit condition. Similarly, time $t_2$ represents the required time for the gate voltage to exceed threshold voltage $V_{LEBTH}$ for a low input supply voltage condition. Also, time $t_3$ represents the required time for the gate voltage to exceed threshold voltage $V_{LEBTH}$ for a high input supply voltage condition.

Moreover, once the voltage on the gate electrode of the MOSFET exceeds the $V_{LEBTH}$ threshold voltage (whatever time that may be depending upon the conditions), the voltage on the gate of the MOSFET has exceeded the Miller plateau voltage and the current spike due to the MOSFET being switched on has substantially reduced and it is safe to activate a pass gate for the current sense signal to pass to a control circuit (reference numeral 32 of FIG. 2) which is used to control the MOSFET. In this manner, the present invention seeks to optimize the delay through an IC by monitoring the gate voltage of the MOSFET device and allows the current limit the control circuit (reference numeral 32 of FIG. 2) to respond more rapidly to an over current condition.

Figure 2:
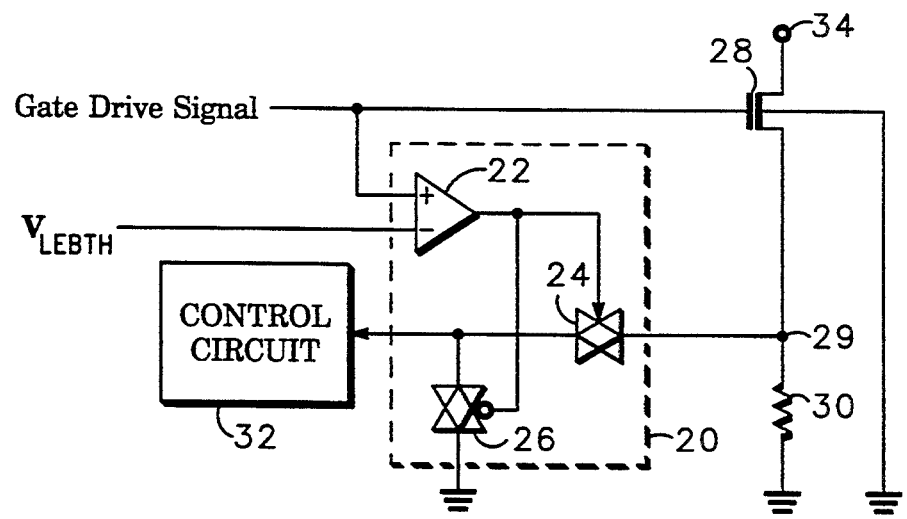
FIG. 2 illustrates a detailed schematic diagram of a leading edge blanking circuit in accordance with the present invention.

Referring to FIG. 2, leading edge blanking (LEB) circuit 20 is shown. LEB circuit 20 includes comparator 22 having a first input responsive to a gate drive signal and a second input responsive to an LEB threshold voltage ($V_{LEBTH}$) which lies somewhere in the LEB threshold range as shown in FIG. 1.

The output of comparator 22 is coupled to the control inputs of transmission gates of 24 and 26 wherein transmission gates 24 and 26 are complementary in nature. A first terminal of transmission gate 24 is coupled to circuit node 29 which is coupled to a source electrode of MOSFET 28 and to a first terminal of sense element 30. The second terminal of sense element 30 is returned to ground reference.

A second terminal of transmission gate 24 is coupled to an input of control circuit 32. A first terminal of transmission gate 26 is coupled to the input of control circuit 32 while the second terminal of transmission gate 26 is returned to ground.

The gate electrode of MOSFET 28 is coupled to receive the gate drive signal while the drain electrode of the same is coupled to terminal 34. Moreover, the substrate of MOSFET 28 is returned to ground reference. It is understood that terminal 34 is typically coupled to an inductive load (not shown), for example, a transformer, wherein MOSFET 28 is the switching device used to switch on and off the inductive load. Also, it is understood that the inductive load is subsequently coupled to an input supply voltage. Further, it is understood that control circuit 32 is coupled back to the gate electrode of MOSFET 28 for disabling the gate drive signal to MOSFET 28 when over current conditions through MOSFET 28 exist or when a peak switched current is reached as, for example, in current mode control applications.

The present invention monitors the voltage appearing at the gate electrode of MOSFET 28 and compares it to a leading edge blanking threshold voltage which is a voltage that lies between the Miller plateau voltage and the desired gate voltage ($V_G$). In particular, when the gate voltage is less than $V_{LEBTH}$, transmission gate 24 is non-operative while transmission gate 26 is operative. This blocks the sense signal appearing at circuit node 29 from passing to control circuit 32 and holds the signal appearing at the input of control circuit 32 at ground reference.

Once the gate drive signal appearing at the first input of comparator 22 exceeds $V_{LEBTH}$, the output of comparator 22 renders transmission gate 24 operative and subsequently renders transmission gate 26 non-operative. As a result, when transmission gate 24 is rendered operative, the current sense signal appearing a circuit node 29 passes through transmission gate 24 and is now applied to the input of control circuit 32 as desired.

It should be understood that the present invention automatically adjusts the leading edge blanking pulse width to variations in the drain voltage. For example, if the drain voltage is shorted high, the pulse width is minimized because, as discussed in FIG. 1, the gate voltage rapidly increases in a short amount time and thus quickly triggers comparator 22. Moreover, it should be understood that LEB circuit 20 comprises minimum circuitry for filtering out (under all conditions and applications) the current spike occurring due to MOSFET 28 being turned on.

LEB circuit 20 has been described to operate in conjunction with a MOSFET. However, the present invention is applicable for use with other field-effect transistors such as insulated-gate bipolar transistors (IGBT's), insulated base transistors (IBT's), MOS control thyristors (MCT's), and current sensing MOSFETs.

By now it should be apparent from the foregoing discussion that a novel leading edge blanking circuit has been provided. The LEB circuit includes a minimum number of components for monitoring a gate voltage of a transistor and passing a current sense signal, which senses the current level through the transistor, to subsequent control circuitry when the gate voltage exceeds a predetermined threshold. Further, the predetermined threshold is chosen to be between the Miller plateau voltage of the transistor and the desired maximum gate voltage.

The foregoing discussion also describes a method for preventing false triggering of a control circuit for a transistor by blanking a sense signal, which senses a current level flowing through the transistor, when the transistor is being switched, the method comprising the steps of monitoring a voltage appearing at a gate electrode of a transistor; providing a threshold voltage that is greater than a Miller plateau voltage of the transistor and less than a maximum voltage being applied to the gate electrode; and passing the sense signal when the gate drive signal exceeds the predetermined threshold voltage.

While the invention has been described in specific embodiments thereof, it is evident that many alterations, modifications and variations will be apparent to those skilled in the art. Further, it is intended to embrace all such alterations, modifications and variations in the appended claims.

I claim:

1. A circuit responsive to a drive signal, which is coupled to a control electrode of a transistor, for passing a current sense signal from a current sense circuit coupled to the transistor, comprising:

a comparator having first and second inputs and an output, said first input of said comparator being coupled to receive the drive signal, said second input of said comparator being coupled to receive a threshold voltage; and transmission gate means for passing the current sense signal when the drive signal exceeds said threshold voltage thereby activating said transmission gate means, said transmission gate means having a control input coupled to said output of said comparator, said transmission gate means having an input coupled to receive the current sense signal, said transmission gate means having an output for passing the sense signal when the drive signal exceeds said threshold voltage, said transmission means including:

(i) a first transmission gate having a control input and first and second terminals, said control input being coupled to said output of said comparator, said first terminal being coupled to receive the current sense signal, said second terminal of said first transmission gate being coupled to said output of said transmission gate means; and (ii) a second transmission gate having a control input and first and second terminals, said control input of said second transmission gate being coupled to said output of said comparator, said first terminal of said second transmission gate being coupled to said output of said transmission gate means, said second terminal of said second transmission gate being coupled to a first supply voltage terminal.

2. A leading edge blanking circuit for providing a leading edge blanking pulse for a transistor when the transistor is being switched, the transistor having gate, drain and source electrodes, a sense circuit is coupled to the transistor for providing a current sense signal indicative of a current level flowing through the transistor, the leading edge blanking circuit comprising:

a control circuit having an input;

transmission gate means for passing the current sense signal to said input of said control circuit, said transmission gate means having an input coupled to the sense circuit and an output coupled to said input of said control circuit, said transmission gate means having a control input; and comparator means having an output coupled to said control input of said transmission gate means for enabling the current sense signal to be passed to said input of said control circuit when a drive signal to the gate electrode of the transistor exceeds a predetermined threshold voltage, said comparator means having first and second inputs, said first input of said comparator means being responsive to said drive signal, said second input of said comparator means being responsive to said predetermined threshold voltage.

3. The leading edge blanking circuit according to claim 2 wherein said predetermined threshold voltage is a voltage between a plateau voltage of the transistor and a desired maximum gate voltage for the transistor.

4. The leading edge blanking circuit according to claim 2 wherein said transmission gate means includes:

a first transmission gate having a control input and first and second terminals, said control input being coupled to said output of said comparator, said first terminal being coupled to receive the current control sense signal, said second terminal of said first transmission gate being coupled to said output of said transmission gate means; and a second transmission gate having a control input and first and second terminals, said control input of said second transmission gate being coupled to said output of said comparator, said first terminal of said second transmission gate being coupled to said output of said transmission gate means, said second terminal of said second transmission gate being coupled to a first supply voltage terminal.

5. A method for providing a leading edge blanking pulse for a transistor when the transistor is being switched, the transistor having a control electrode, a first current conducting electrode, and a second current conducting electrode, wherein a sense circuit is coupled to said first current conducting electrode of the transistor and provides a current sense signal indicative of a current level flowing through the transistor, the method comprising the steps of:

monitoring a voltage appearing at said control electrode of the transistor;

providing a threshold voltage that is greater than a plateau voltage of the transistor and less than a maximum voltage being applied to said control electrode of the transistor;

sensing a current signal appearing at said first current conducting electrode of the transistor; and passing said sensed current signal when said voltage appearing at said control electrode of the transistor exceeds said threshold voltage.

* * * * *

UNITED STATES PATENT AND TRADEMARK OFFICE
CERTIFICATE OF CORRECTION

PATENT NO. : 5,418,410
DATED : May 23, 1995
INVENTOR(S) : Eric W. Tisinger

It is certified that error appears in the above-indentified patent and that said Letters Patent is hereby corrected as shown below:

In column 6, lines 6-7, claim 4, delete "control".

Signed and Sealed this

Twenty-fourth Day of October, 1995

Attest:

BRUCE LEHMAN

Attesting Officer          Commissioner of Patents and Trademarks